United States Patent [19]

Johncock et al.

[11] Patent Number: 4,715,927

[45] Date of Patent: * Dec. 29, 1987

[54] IMPROVED METHOD OF MAKING A PHOTOCONDUCTIVE MEMBER

[75] Inventors: Annette G. Johncock, Walled Lake; Stephen J. Hudgens, Southfield, both of Mich.

[73] Assignee: Energy Conversion Devices, Inc., Troy, Mich.

[*] Notice: The portion of the term of this patent subsequent to May 14, 2002 has been disclaimed.

[21] Appl. No.: 941,244

[22] Filed: Nov. 21, 1986

Related U.S. Application Data

[62] Continuation of Ser. No. 580,081, Feb. 14, 1984, abandoned.

[51] Int. Cl.$^4$ .............................................. C30B 25/02
[52] U.S. Cl. .................... 156/606; 156/613; 156/614; 156/DIG. 64; 427/89; 430/65; 430/67
[58] Field of Search ....... 156/614, 606, 613, DIG. 64, 156/DIG. 89; 204/164; 427/39, 74; 430/65, 67, 85, 86, 132, 133, 135, 136

[56] References Cited

U.S. PATENT DOCUMENTS 4,666,808 5/1987 Kawamura et al. ................ 430/65
4,675,264 6/1987 Kawamura et al. ................ 430/65

*Primary Examiner*—Gregory A. Heller
*Assistant Examiner*—Robert M. Kunemund
*Attorney, Agent, or Firm*—Marvin S. Siskind; Richard M. Goldman

[57] ABSTRACT

A process for making photoconductive semiconductor alloys and members with high reaction gas conversion efficiencies and at high deposition rates utilizes microwave energy to form a deposition plasma. The high deposition rates and high gas conversion efficiencies allow photoconductive members to be formed of amorphous semiconductor alloys at commercially viable rates.

The process includes coupling microwave energy into a substantially enclosed reaction vessel containing a substrate and depositing amorphous photoconductive alloys onto the substrate from a reaction gas introduced into the vessel. The photoconductive member includes a bottom blocking layer, a photoconductive layer and a top blocking layer. The photoconductive member can be formed in a negative or positive charge type configuration. The members can include a top blocking enhancement layer and/or an improved infrared photoresponsive layer.

48 Claims, 9 Drawing Figures

IMPROVED METHOD OF MAKING A PHOTOCONDUCTIVE MEMBER

This application is a continuation of application Ser. No. 580,081 filed on Feb. 14, 1984, now abandoned.

BACKGROUND OF THE INVENTION

This invention relates to a method of making photoconductive alloys and members in a commercially viable process. The process provides both a commercially viable reaction gas conversion efficiency and a commercially viable deposition rate. While forming photoconductive members from silicon based amorphous semiconductor alloys has been suggested, the methods of forming the alloys have been at a too slow deposition rate and a gas conversion efficiency which is too low for any commercial viability. The invention more particularly relates to a method of making the alloys and members by microwave plasma deposition of a selected reaction gas or gases. Further, new photoconductive members having an enhanced top blocking layer and/or an improved infrared photoresponse can be formed. The photoconductive members can be formed to accept either a positive or a negative charge.

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientists to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

In summary, crystal silicon devices have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films could not be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193–1196, 1975, toward the end of reducing the localized states in the energy gap in amorphous silicon or germanium to make the same approximate more closely intrinsic crystalline silicon or germanium and or substitutionally doping the amorphous materials with suitable classic dopants, as in doping crystalline materials, to make them extrinsic and or p or n conduction types.

The reduction of the localized states was accomplished by glow discharge deposition of amorphous silicon films wherein a gas of silane ($SiH_4$) was passed through a reaction tube where the gas was decomposed by an radio frequency (RF) glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphine ($PH_3$) for n-type conduction or a gas of diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited including supposedly substitutional phosphorus or boron dopant and was shown to be extrinsic and of n or p conduction-type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

The incorporation of hydrogen in the above RF deposition method not only has limitations based upon the fixed ratio of hydrogen to silicon in silane, but, more importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting density of states of the RF silane deposited materials leads to a narrow depletion width, which in turn limits the efficiencies of solar cells and other devices whose operation depends on the drift of free carriers. The RF method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states in the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which rssued on Aug. 12, 1980, under the same title. As disclosed in these patents, which are incorporated herein by reference, fluorine is introduced into the amorphous silicon semiconductor to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity. Hence, fluorine is qualitatively different from other halogens and so is considered a super-halogen.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the new alloy so formed has a low density or defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships About forty-five years ago, C. Carlson developed the first electrophotographic process based on a sulfur material. Other chalcogenides such as selenium and selenium alloys were thereafter suggested for such applications together with organic substances such as polyvinyl carbazole (PVK). These materials, however, exhibited certain deficiencies. They were toxic, and therefore difficult to handle, soft, and therefore subject to wear, and had poor infrared light photoresponse.

In view of the above noted deficiencies of these materials, silicon based amorphous semiconductor alloys were investigated for possible applications in electrophotographic processes. These materials were considered likely to be useful because of the hardness of amorphous silicon alloys, because of their nontoxic nature, and because of their improved photoresponse to infrared light. Also, as previously mentioned, these materials could be made with a density of states reduced to a point where charging of the materials to the potentials required for electrophotographic replication was considered possible. Thus, amorphous semiconductor alloys made by the processes hereinabove described have demonstrated photoresponsive characteristic which are suited for electrophotographic applications.

It has been suggested to utilize the RF generated alloys in photoconductive members with a bottom and a top blocking layer. The photoconductive members need to be on the order of 15 microns thick for the members to be charged to a sufficient saturation voltage, to be practical, about 350 volts. The prior art RF processes however have suffered from relatively slow deposition rates on the order of 10 Angstroms or less per second and low utilization of the reaction gas feed stock which are important considerations from the standpoint of making the photoconductive members from these materials on a commercial basis. If the deposition rate is increased above about 10 Angstroms per second, such as by increasing the RF power applied, then deleterious powder and/or polymers are formed and incorporated in the alloys.

Applicants herein have discovered a new and improved process for making photoconductive amorphous semiconductor alloys and members and improved device structures. The inventive process herein provides substantially increased deposition rates and reaction gas conversion efficiencies without formation of polymers or powder, so as to be commercially viable. The invention also can provide an enhanced top blocking layer and/or an improved infrared photoresponse.

SUMMARY OF THE INVENTION

The present invention provides an improved process for making photoconductive alloys and members at a commercially viable reaction gas conversion efficiency and deposition rate, substantially higher than possible in the prior art. Further, photoconductive members can be formed which have an enhanced top blocking layer and/or an improved infrared photoresponse. The members can be formed to be positively or negatively charged.

In accordance with the invention, the process includes providing a source of microwave energy, coupling the microwave energy into a substantially enclosed reaction vessel which contains a substrate onto which the photoconductive alloys are deposited. The alloys are deposited from a reaction gas which includes at least one semiconductor element to be deposited. The microwave energy and the reaction gas form a glow discharge plasma within the vessel to deposit an amorphous photoconductive semiconductor alloy from the reaction gas onto the substrate.

The reaction gas can include silane ($SiH_4$), silicon tetrafluoride ($SiF_4$), diborane ($B_2H_6$), phosphine ($PH_3$), hydrogen ($H_2$), germanium tetrafluoride ($GeF_4$) and germane ($GeH_4$) and combinations thereof. A positive charge type photoconductive member can be formed by depositing a first blocking layer onto the substrate to prevent electron injection from the substrate into the photoconductive layer. The blocking layer is formed of p-type amorphous silicon alloy with hydrogen and/or fluorine on the order of 200 to 2000 Angstroms thick. A second photoconductive layer is formed on the blocking layer of substantially intrinsic amorphous silicon alloy with hydrogen and/or fluorine on the order of 10 to 25 microns thick. A top blocking layer is formed on the photoconductive layer, which is formed of an insulating alloy to provide a high charge capability, slow dark decay and a mechanically hard surface. The top blocking layer also provides chemical resistance to moisture and temperature effects to provide the member with improved stability. The top blocking layer is formed of an alloy of silicon, hydrogen and/or fluorine and at least one of carbon, nitrogen or oxygen on the order of 50 to 1000 Angstroms thick. The top layer can be formed with the addition of oxygen ($O_2$), methane ($CH_4$), ammonia ($NH_3$) or nitrogen ($N_2$).

A negative charge type photoconductive member can be formed by depositing a first blocking layer onto the substrate to prevent hole injection from the substrate into the photoconductive layer. The blocking layer is formed of n-type amorphous silicon alloy with hydrogen and/or fluorine on the order of 200 to 2000 Angstroms thick. A second photoconductive layer is formed on the blocking layer of slightly n-type intrinsic amorphous silicon alloy with hydrogen and/or fluorine on the order of 10 to 25 microns thick. A top blocking layer is formed on the photoconductive layer of an insulating alloy to provide the previously mentioned features. The top blocking insulative alloy can be formed in the same manner as the positive charge type layer, also on the order of 50 to 1000 Angstroms thick.

A top blocking enhancement layer can be added before the top blocking layer in either the positive or negative type charge member by depositing a high quality amorphous alloy from a radio frequency (RF) glow discharge. The enhancement layer is formed of a substantially intrinsic alloy for the positive charge type members and a slightly n-type intrinsic alloy for the negative charge type members. Either type layer is formed from an amorphous alloy of silicon, hydrogen and/or fluorine on the order of a depletion width, about 1000 to 4000 Angstroms, in thickness. An infrared photoresponsive layer can be added to either type member before the top blocking layer, with or without the top blocking enhancement layer. The infrared responsive layer is formed from an alloy of amorphous silicon, hydrogen and/or fluorine and a low band gap semiconductor, such as germanium, on the order of 10,000 Angstroms thick.

DESCRIPTION OF THE PREFERRED EMBODIMENTS

Figure 1:
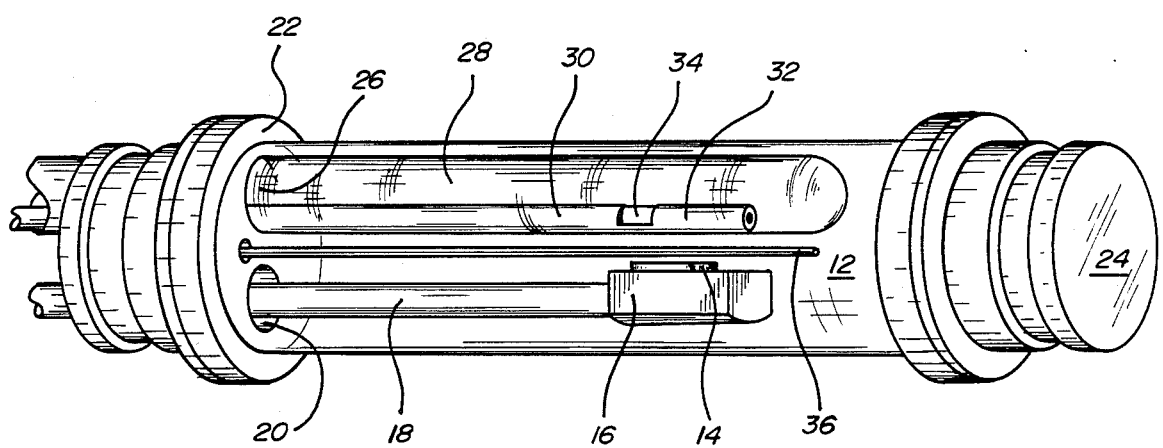
FIG. 1 is a perspective view, partly broken away, of a microwave plasma deposition system for depositing photoconductive amorphous semiconductor alloys and members in accordance with the process of the invention.

Referring now more particularly to FIG. 1, a microwave deposition apparatus suitable for practicing the process of the present invention, is generally designated 10. The apparatus 10 includes a transparent tubular chamber or reaction vessel 12 containing a substrate 14 upon which the photoconductive amorphous semiconductor alloys are to be deposited. The substrate 14 is mounted on a substrate holder 16 which is mounted on a rod or shaft 18. The substrate holder 16 can include appropriate heater and control means (not illustrated) for controlling the temperature of the substrate 14. The shaft 18 is sealingly passed through an opening 20 in an end cap 22. The opposite end of the chamber 12 is sealed by a second end cap 24. The end cap 24 serves only to seal the chamber 12, while the end cap 22 provides the opening 20 for the substrate holder 16 and openings for the introduction and evacuation of reaction gases (not shown) and an opening 26 for an antenna tube 28.

A portion of the antenna tube 28 is cut away to illustrate a microwave antenna 30 which is of a type having one of more slots 32. The slotted antenna 30 can be of the type disclosed in U.S. application Ser. No. 441,280, entitled "An Improved Apparatus For The Manufacture Of Photovoltaic Devices", filed in the names of Eugene Fournier and Jochim Doehler on Nov. 12, 1982, which is incorporated herein by reference. The antenna system can also be of the type disclosed in U.S. Pat. No. 4,517,223 entitled "Method Of Making Amorphous Semiconductor Alloys And Devices Using Microwave Energy", filed in the names of Stanford R. Ovshinsky, David D. Allred, Lee Walter and Stephen J. Hudgens on Sept. 24, 1982, which is also incorporated herein by reference.

A source of microwave energy is coupled to the antenna 30 which couples the energy into the reaction vessel 12. The combination of the reaction gases and the microwave energy from the antenna 30 causes the formation of a plasma in the area of the substrate 14, resulting in the deposition of a photoconductive alloy on the substrated. In accordance with the present invention, the reaction gases include at least one semiconductor element to form the plasma. The temperature of the substrate 14 is maintained about 300 degrees Centigrade and the frequency of the microwave energy can be 2.45 Gigahertz and above, preferably about 2.45 Gigahertz. As mentioned, the combined microwave energy and the reaction gas form the plasma to permit the deposition process to proceed.

In operation, the system 10 is first pumped down to below a desired deposition pressure, such as $10^{-5}$ Torr. The reaction gases such as silicon tetrafluoride ($SiF_4$), silane ($SiH_4$), germanium tetrafluoride ($GeF_4$), germane ($GeH_4$), hydrogen ($H_2$), diborane ($B_2H_6$), phosphine ($PH_3$), oxygen ($O_2$), methane ($CH_4$), nitrogen ($N_2$), ammonia ($NH_3$) or combinations thereof, are fed into the vessel 12 through the end cap 22. A diluent, such as argon (Ar), also can be utilized, where desired. The vessel 12 is brought up to the desired operating pressure of, for example, 0.05 Torr.

The microwave energy from the antenna 30 is directed into the vessel 12 to form a plasma in the area of the substrate 14. As a result, an amorphous semiconductor alloy is deposited onto the substrate 14. The heater maintains the substrate at a temperature of about 300° Centigrade. The output power of the microwave energy source is adjusted preferably to about 0.1 to 1 watt per cubic centimeter in power density. The flow rate of the reaction gases can be between 1 to 20 SCCM. With the foregoing system parameters, deposition rates of at least 100 Angstroms per second can be obtained. Even at these high deposition rates, the deposited amorphous semiconductor films exhibit high quality photoresponsive characteristics suitable for electrophotographic applications.

One of the critical factors in making the high quality alloys at deposition rates of 100 Angstroms per second and greater is the low operating pressure. The operating pressure of 0.05 Torr is about an order of magnitude below a conventional RF deposition pressure of 0.5 Torr.

Even at the deposition rate of 100 Angstroms per second, the alloys do not contain any significant polymer or powder inclusions. Attempts to deposit these semiconductor alloys with a high RF deposition rate of greater than 10 Angstroms per second, but below even 20 Angstroms per second, leads to very poor quality alloys with large polymer ($SiH_{2n}$) and/or powder inclusions.

For commercially viable photoconductive members to be manufactured, the deposition time and the amount of materials utilized must be minimized. Clearly, a deposition rate of ten times or greater that of the RF rate provides an enormous economic advantage. Further, the reaction gas conversion efficiency is also dramatically different for the microwave process of the present invention than for the prior art RF deposition process. A typical RF process is much less efficient in converting and depositing the reaction gas and typically converts on the order of two percent of the reaction gas into the amorphous silicon alloy. The microwave process of the present invention in dramatic contrast converts substantially one-hundred percent of the reaction gases into depositing species. This provides another enormous economic advantage in depositing the thicknesses of semiconductor alloy which are necessary to have a practical photoconductive member or device.

Figure 2:
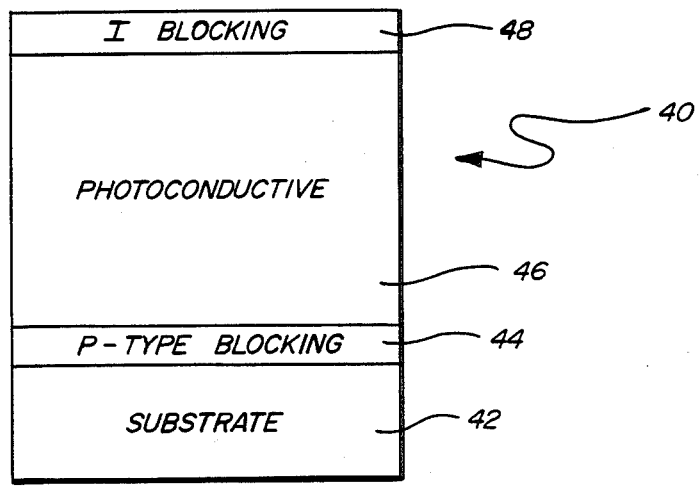
FIG. 2 is a fragmentary sectional view of a positive charge type embodiment of a photoconductive member to illustrate one application of the amorphous semiconductor photoreceptive alloys made by the process of the invention.

FIG. 2 illustrates a first positive charge type photoconductive member or device 34, which includes a substrate 36, a first p-type blocking layer 38, a photoconductive layer 40 and a top insulating (I) blocking layer 42. The substrate 36 can be formed of any convenient material which is either conductive, such as a metal, or has a conductive coating formed thereon, such as glass or a polymer. The first or bottom blocking layer 38 is formed of a p-type amorphous silicon, hydrogen and/or fluorine alloy. The device 34 in such a configuration is a positively charged device and the layer 38 prevents electron injection from the substrate 36 into the photoconductive layer 40.

The blocking layer 38 preferably is formed from a reaction gas mixture of $SiH_4$ and $B_2H_6$ in $H_2$ or $SiH_4$ and/or $SiF_4$ and $B_2H_6$ in $H_2$. The blocking layer 38 is formed to create an alloy with a high p-type conductivity activation energy ($\Delta E$) of 0.2 to 0.3 eV. One preferable combination is 20 parts $SiH_4$, 5 parts $SiF_4$ and 2 parts of a mixture of 5.5 percent $B_2H_6$ in $H_2$. A second preferable combination is about 20 parts $SiH_4$ and 2 parts of a mixture of 5.5 percent $B_2H_6$ in $H_2$. The layer 38 preferably is deposited with an effective power density in the range of 0.1 to 1.0 watts per cubic centimeter, and preferably about 0.7 watts per cubic centimeter. The layer 38 preferably is from 200 to 2000 Angstroms thick.

The photoconductive layer 40 preferably also is deposited with an effective power density in the range of 0.1 to 1.0 watts per cubic centimeter, and preferably about 0.7 watts per cubic centimeter. The layer 40 preferably is deposited to a thickness of 10 to 25 microns to form an overall thickness of the alloy layers of at least 10 to 25 microns. The 10 micron thickness is to ensure a saturation voltage of about 350 volts. The photoconductive alloy can sustain a electric field of up to about 35 to 40 volts per micron of thickness. The layer 40 preferably is formed from a reaction gas mixture of $SiH_4$ or $SiH_4$ and/or $SiF_4$ with a small amount of p-type dopant to form a substantially intrinsic alloy. The alloy with no dopant is slightly n-type exhibiting a $\Delta E$ of 0.7 eV. The addition of the small amount of p-type dopant changes $\Delta E$ to about 1.0 eV. One preferable combination is 20 parts $SiH_4$, 5 parts $SiF_4$ and 0.5 parts of a mixture of 550 ppm of $B_2H_6$ in $H_2$. A second preferable combination is 20 parts $SiH_4$ and 0.5 parts of a mixture of 550 ppm of $B_2H_6$ in $H_2$.

The top blocking layer 42 is formed as an insulator to provide the high charging capacity of 35 to 40 volts/micron of thickness of the combined layers 38, 40 and 42. The layer 42 also provides a slow dark decay on the order of less than fifteen percent in one second and a very hard surface as compared to any chalcogenide, for example Se or $Se_{92}Te_8$. The blocking layer 42 is chemically resistant to moisture and temperature effects to provide the member with improved stability. The layer has a band gap of greater than 3.0 Ev. The blocking layer 42 preferably is formed from a reaction gas mixture of $SiH_4$ or $SiH_4$ and/or $SiF_4$ and at least one of oxygen, carbon or nitrogen. One preferable combination is 22 parts $CH_4$ and 10 parts $SiH_4$. A second preferable combination is 22 parts $CH_4$, 10 parts $SiH_4$ and 10 parts $SiF_4$. An oxide blocking layer of $SiO_2$ can be formed from 1 part $H_2$ and 5 parts of 5 percent $O_2$ in $SiF_4$. The oxide layer can be deposited at a power density of 0.34 watts per cubic centimeter, and a substrate temperature of 350° C. at about 48 Angstroms per second. A nitride blocking layer also can be formed from $N_2$ and $SiH_4$ or $NH_3$ and $SiH_4$. The layer 42 is deposited at a power density in the range of 0.2 to 1.2 watts per cubic centimeter and preferably is from 50 to 1000 Angstroms thick.

The layers 38 and 40 are deposited at 100 Angstroms per second or greater, which as mentioned above is at least ten times the deposition rate of prior art methods. Approximately eighty percent of the reaction gas can be utilized which is also significantly greater than the prior art utilization percentage of about two percent. The top insulative layer 42 is deposited at a somewhat slower rate of about 30 Angstroms per second which is still much greater than the RF deposition rate of the prior art.

Figure 3:
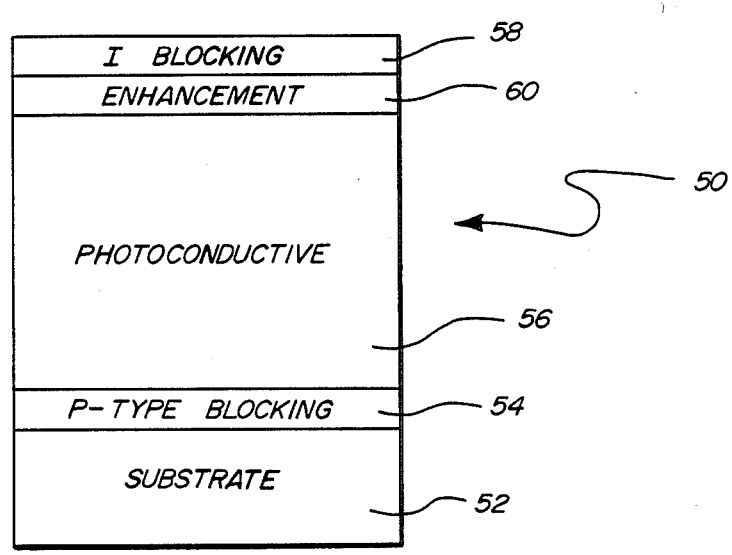
FIG. 3 is a fragmentary sectional view of a positive charge type photoconductive member which has an enhanced top blocking layer made by the process of the invention.

FIG. 3 illustrates another positive charge type photoconductive member embodiment 44 which has a enhanced top blocking layer. A substrate 46, a bottom p-type blocking layer 48, a photoconductive layer 50 and a top blocking layer 52 are provided which are essentially the same as the similarly described layers in FIG. 2. An enhanced top blocking layer 54 is deposited before the blocking layer 52. Although the microwave deposition provides a high quality alloy layer, it can contain more defects because of the high deposition rate than a properly deposited RF layer. The layer 54 is then deposited by a conventional RF plasma to provide a high quality layer with a density of states which is lower than the microwave deposited photoconductive layer 50. The RF layer 54 enhances the blocking layer 52, because the lower density of states provides greater band bending and thus better charge retention. The effective overall deposition rate and reaction gas utilization is not lowered too significantly, since the layer 54 preferably is on the order of a depletion width thick, generally 1000 to 4000 Angstroms. The layer 54 can be deposited from the same reaction gas mixture as the photoconductive layer 50.

Figure 4:
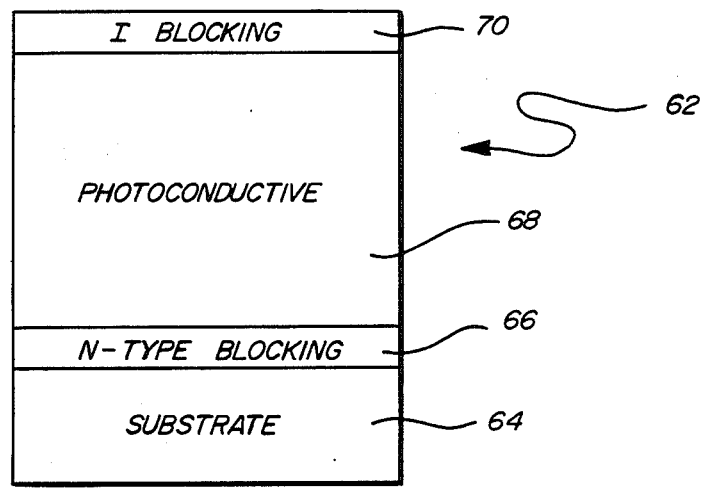
FIG. 4 is a fragmentary sectional view of a positive charge type photoconductive member which has an improved infrared photoresponse made by the process of the invention.

FIG. 4 illustrates a positive charge type photoconductive member or device 56 which has an improved infrared (IR) photoresponse. A substrate 58, a bottom blocking layer 60, a photoconductive layer 62 and a top I blocking layer 64 are provided which are essentially the same as the similarly described layers in FIG. 2. The improved IR photoresponse is provided by a low band gap layer 66. The photoconductive layer 62 generally has a band gap in the range of 1.7 to 1.8 eV, which is suitable for most photoresponsive applications, however, it is not low enough for IR applications, such as laser line printers. A laser line printer can be operated with a diode GaAs laser at about 840 nm. The low band gap IR layer 66 can be formed from a reaction gas mixture and process which can be the same as that described in depositing the layer 62 with the addition of a low band gap semiconductor element, such as germanium. Germanium can be added to the gas mixture in the form of germane ($GeH_4$) or germanium tetrafluoride ($GeF_4$). The IR layer 66 can be formed about 10,000 Angstroms thick with a band gap of about 1.5 eV. The IR layer 66 can be formed from a reaction gas mixture of 1 part $GeH_4$, 5 parts $SiF_4$ and 3 parts $H_2$. The layer can be deposited with an effective power density in the range of 0.1 to 1.0 watts per cubic centimeter and preferably at a power density of 0.34 watts per cubic centimeter at about 13 Angstroms per second with a substrate temperature of 275° C. The lower band gap provides an additional response in the IR frequencies. For utilization of the photoconductive members with light which is predominantly of wavelengths shorter than the IR range, the IR layer 66 has less utility and can be eliminated.

The IR layer 66 also can be deposited by a conventional RF plasma to provide both the enhanced top blocking layer provided by the layer 54 and the IR photoresponse.

Figure 5:
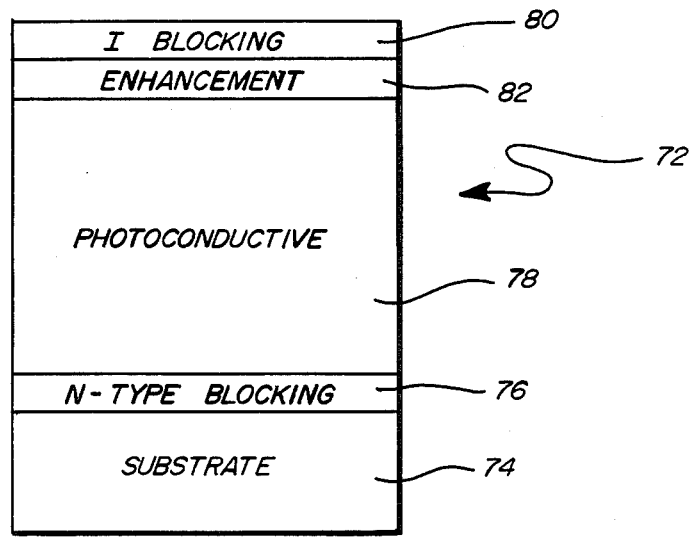
FIG. 5 is a fragmentary sectional view of a positive charge type photoconductive member having an enhanced top blocking layer and an improved infrared photoresponse made by the process of the invention.

FIG. 5 illustrates a positive charge type photoconductive member or device 68 which has both an enhanced top blocking layer and an improved IR photoresponse. A substrate 70, a bottom blocking layer 72, a photoconductive layer 74 and a top blocking layer 76 are provided and are essentially the same as the similarly described layers in FIG. 2. A microwave deposited low band gap IR layer 78 is provided with a top blocking enhancement layer 80, which are essentially the same as the similarly described layers in FIGS. 4 and 3, respectively.

Although some conventional photoconductive members, such as Se based drums, are positive charge type devices, the amorphous photoconductive alloy members of the present invention are particularly suitable to be utilized as negative charge type devices, as well. The product of the electron mobility and tau, the electron recombination lifetime, of these alloys is greater in the undoped alloy material than that of the holes and thus unlike the chalcogenide based systems, these alloys can operate in either the positive or negative charge type configurations. FIGS. 6–9 are directed to negative charge type devices or members.

Figure 6:
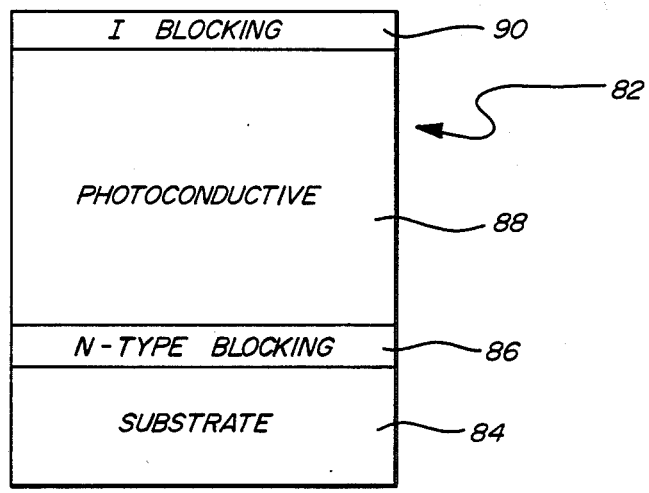
FIG. 6 is a fragmentary sectional view of a negative charge type embodiment of a photoconductive member to illustrate one application of the amorphous semiconductor photoreceptive alloys made by the process of the invention.

FIG. 6 illustrates a first negative charge type photoconductive member or device 82, which includes a substrate 84, a first n-type blocking layer 86, a photoconductive layer 88 and a top insulative blocking layer 90. The substrate 84 again can be formed of any convenient material which is either conductive, such as a metal, or has a conductive coating formed thereon, such as glass or a polymer. The first or bottom blocking layer 86 is formed of an n-type amorphous silicon, hydrogen and/or fluorine alloy. The device 82 in such a configuration is a negatively charged device and the layer 86 prevents hole injection from the substrate 84 into the photoconductive layer 88.

The blocking layer 86 preferably is formed from a reaction gas mixture of $SiH_4$ and $PH_3$ in $H_2$ or $SiH_4$ and/or $SiF_4$ and $PH_3$ in $H_2$. One preferable combination is 20 parts $SiH_4$, 5 parts $SiF_4$ and 2 parts of a mixture of 5.5 percent $PH_3$ in $H_2$. A second preferable combination is about 20 parts $SiH_4$ and 2 parts of a mixture of 5.5 percent $PH_3$ in $H_2$. The layer 86 preferably is deposited with an effective power density in the range of 0.1 to 1.0 watts per cubic centimeter, and preferably about 0.7 watts per cubic centimeter. The layer 86 preferably is from 200 to 2000 Angstroms thick. The layer has a high n-type $\Delta E$ of 0.2 to 0.3 eV.

The photoconductive layer 88 preferably also is deposited with an effective power density in the range of 0.1 to 1.0 watts per cubic centimeter and preferably about 0.7 watts per cubic centimeter. The layer 88 preferably is deposited to a thickness of from 10 to 25 microns to form an overall thickness of the alloy layers of at least 10 to 25 microns. The 10 micron thickness is to ensure a saturation voltage of at least 350 volts. The alloy can sustain an electric field of up to about 35 to 40 volts per micron of thickness. The layer 88 preferably is formed from a reaction gas mixture of $SiH_4$ or $SiH_4$ and/or $SiF_4$ to form an intrinsic alloy with a $\Delta E$ of about 0.7–0.9 eV (the intrinsic alloy is slightly n-type). One preferable combination is 20 parts $SiH_4$ and 5 parts $SiF_4$. A second preferable combination is 20 parts $SiH_4$.

The top blocking layer 90 is formed as an insulator to provide the high charging capacity of 35 to 40 volts/micron of thickness of the combined layers 86, 88 and 90. The layer 90 also provides a slow dark decay on the order of less than fifteen percent in one second and a very hard surface as compared to any chalcogenide, for example Se or $Se_{92}Te_8$. The layer 90 again is chemically resistant to provide an improved member stability and has a band gap greater than 3.0 eV. The blocking layer 90 can be formed as an insulator from a reaction gas mixture of $SiH_4$ or $SiH_4$ and/or $SiF_4$ and at least one of oxygen, carbon or nitrogen. One preferable combination is 22 parts $CH_4$ and 10 parts $SiH_4$. A second preferable combination is 22 parts $CH_4$, 10 parts $SiH_4$ and 10 parts $SiF_4$. An oxide blocking layer of $SiO_2$ can be formed from 1 part $H_2$ and 5 parts of 5 percent $O_2$ in $SiF_4$. The oxide layer can be deposited with a power density of about 0.34 watts per cubic centimeter, a substrate temperature of 350° C. at about 48 Angstroms per second. A nitride blocking layer also can be formed from $N_2$ and $SiH_4$ or $NH_3$ and $SiH_4$. The layer 90 is deposited at an effective power density in the range of 0.1 to 1.0 watts per cubic centimeter and preferably is 50 to 1000 Angstroms thick.

The layers 86 and 88 are again deposited at 100 Angstroms per second or greater, which as mentioned above is at least ten times the deposition rate of prior art methods. Again, approximately eighty percent of the reaction gas can be utilized which is also significantly greater than the prior art utilization percentage of approximately two percent. The top layer 90 is deposited at a somewhat slower rate of about 30 Angstroms per second which is still much greater than the RF deposition rate of the prior art.

Figure 7:
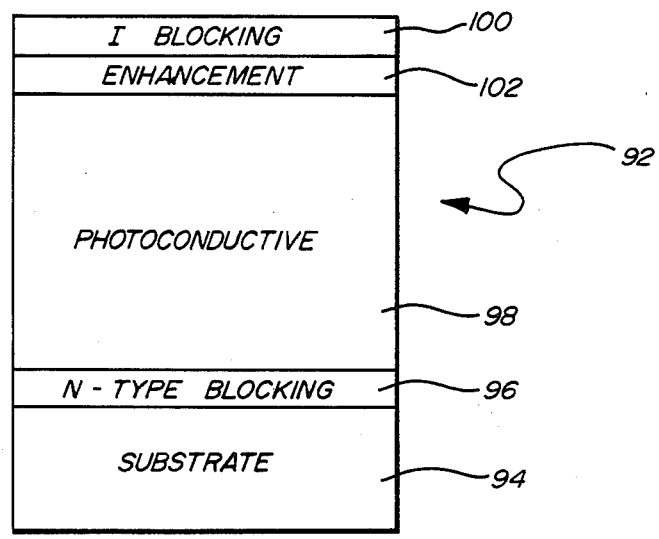
FIG. 7 is a fragmentary sectional view of a negative charge type photoconductive member which has an enhanced top blocking layer made by the process of the invention.

FIG. 7 illustrates another negative charge type photoconductive member embodiment 92 which has an enhanced top blocking layer, similar to the member 68. A substrate 94, a bottom n-type blocking layer 96, a photoconductive layer 98 and a top I blocking layer 100 are provided which are essentially the same as the similarly described layers in FIG. 6. An enhanced top blocking layer 102 is deposited before the blocking layer 100. As described above, although the microwave deposition provides a high quality alloy layer, it can contain more defects because of the high deposition rate than a properly deposited RF layer. The layer 102 is then deposited by a conventional RF plasma to provide a high quality layer with a density of states which is lower than the microwave deposited photoconductive layer 98. The RF layer 102 enhances the blocking layer 100, because the lower density of states provides greater band bending and better charge retention. The effective overall deposition rate and reaction gas utilization is not lowered too significantly, since the layer 102 preferably is on the order of a depletion width thick, generally 1000 to 4000 Angstroms. The layer 102 can be deposited from the same reaction was mixture as the photoconductive layer 98.

Figure 8:
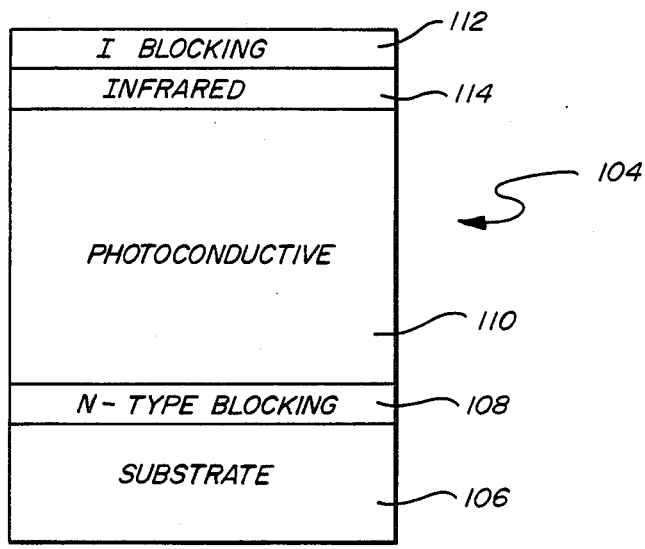
FIG. 8 is a fragmentary sectional view of a negative charge type photoconductive member which has an improved infrared photoresponse made by the process of the invention.

FIG. 8 illustrates a negative charge type photoconductive member or device 104 which has an improved IR photoresponse. A substrate 106, a bottom blocking layer 108, a photoconductive layer 110 and a top I blocking layer 112 are provided which are essentially the same as the similarly described layers in FIG. 6. The improved IR photoresponse is provided by a low band gap layer 114. The photoconductive layer 110, again generally has a band gap in the range of 1.7 to 1.8 eV, which is suitable for most photoresponsive applications, however, it is not low enough for IR applications, such as laser line printers. A laser line printer can be operated with a diode GaAs laser at about 840 nm. The low band gap layer 114 can be formed from a reaction gas mixture and process which can be the same as that described in depositing the layer 88 with the addition of a low band gap semiconductor element, such as germanium.

Germanium can be added to the gas mixture in the form of germane ($GeH_4$) or germanium tetrafluoride ($GeF_4$). The layer 114 can be formed about 10,000 Angstroms thick with a band gap of about 1.5 eV. The layer 114 can be formed from a reaction gas mixture of 1 part $GeH_4$, 5 parts $SiF_4$ and 3 parts $H_2$. The layer can be deposited at a power density of 0.34 watts per cubic centimeter at about 13 Angstroms per second with a substrate temperature of 275° C. The lower band gap provides an additional response in the IR frequencies. For utilization of the photoconductive members with light which is predominantly of wavelengths shorter than the IR range, the layer 114 has less utility and can be eliminated.

The layer 114 also can be deposited by a convention RF plasma to provide both the enhanced top blocking layer provided by the layer 102 and the improved IR photoresponse.

Figure 9:
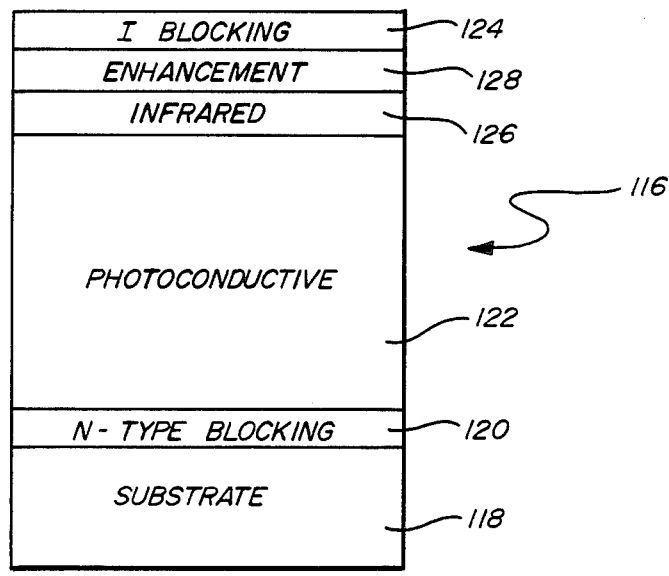
FIG. 9 is a fragmentary sectional view of a negative charge type photoconductive member having an enhanced top blocking layer and an improved infrared photoresponse made by the process of the invention.

FIG. 9 illustrates a negative charge type photoconductive member or device 116 which has both an enhanced top blocking layer and an improved IR photoresponse. A substrate 118, a bottom blocking layer 120, a photoconductive layer 122 and a top blocking layer 124 are provided and are essentially the same as the similarly described layers in FIG. 6. A microwave deposited low band gap IR layer 126 is followed by a top blocking enhancement layer 128, which are essentially the same as the similarly described layers in FIGS. 8 and 7, respectively.

Modifications and variations of the present invention are possible in light of the above teachings. While a planar stationary substrate 14 has been described in FIG. 1, the photoconductive members can also be deposited on a drum-shaped substrate when desired. The rod or shaft 18 then can be rotated to coat the outside of the drum or cylinder. A most preferable system and method of depositing on one or more drums is disclosed in Case 711 pending U.S. application Ser. No. 680,086, entitled "Method And Apparatus For Making Electrophotographic Devices", filed concurrently herewith, in the names of Eugene Fournier, et al., which is incorporated herein by reference. The bottom blocking layers do not have to be amorphous and can be, for example, polycrystalline. (By the term "amorphous" is meant an alloy or material which has long range disorder, although it may have short or intermediate order or even contain at times some crystalline inclusions.) It is therefore, to be understood that within the scope of the appended claims the invention may be practiced otherwise than as specifically described.

What is claimed and desired to be secured by Letters Patent of the United States is:

1. An improved method of forming a photoconductive member, comprising:
    providing a substrate;
    providing a source of microwave energy;
    providing an enclosed reaction vessel;
    operatively disposing said substrate in said vessel;
    coupling microwave energy from said source into the interior of said vessel;
    introducing into said vessel at least one reaction gas, said reaction gas including at least one semiconductor element to be deposited;
    energizing said source of microwave energy to generate a plasma in said vessel and to deposit semiconductor alloy material from said reaction gas onto said substrate;
    evacuating said vessel to an operating pressure about an order of magnitude below conventional RF deposition pressure;
    depositing a bottom blocking layer onto said substrate by adding at least one dopant to said reaction gas;
    depositing a substantially intrinsic, amorphous photoconductive layer onto said blocking layer said photoconductive layer having a first density of defect states;
    changing at least one deposition parameter so as to deposit an enhancement layer atop said photoconductive layer, said enhancement layer having a second density of defect states less than said first density of defect states; and
    depositing a hard top stabilizing layer atop said enhancement layer, said hard top stabilizing layer formed from a reaction gas which includes at least one of carbon, nitrogen or oxygen.

2. The method as defined in claim 1 wherein said reaction gas contains at least silicon.

3. The method as defined in claim 1 wherein said reaction gas contains at least hydrogen.

4. The method as defined in claim 3 wherein said reaction gas further contains at least fluorine.

5. The method as defined in claim 1 wherein said reaction gas contains at least fluorine.

6. The method as defined in claim 1 including depositing said bottom blocking layer by adding a p-type dopant.

7. The method as defined in claim 6 including depositing said bottom blocking layer from a reaction gas mixture including silicon, fluorine, hydrogen and boron.

8. The method as defined in claim 7 including depositing about 200 to 2000 Angstroms of said bottom blocking layer onto said substrate from a reaction gas mixture of $SiH_4$, $SiF_4$, $B_2H_6$ and $H_2$.

9. The method as defined in claim 6 including depositing said bottom blocking layer from a reaction gas mixture including silicon, hydrogen and boron.

10. The method as defined in claim 9 including depositing about 200 to 2000 Angstroms of said bottom blocking layer onto said substrate from a reaction gas mixture of $SiH_4$, $B_2H_6$ and $H_2$.

11. The method as defined in claim 1 including depositing said bottom blocking layer with an effective power density in the range of 0.1 to 1.0 watts per cubic centimeter.

12. The method as defined in claim 1 including depositing said bottom blocking layer at a deposition rate of at least 100 Angstroms per second at an operating pressure of less than 0.1 Torr.

13. The method as defined in claim 1 including depositing said photoconductive layer from a reaction gas mixture including silicon, fluorine, hydrogen and a p-type dopant.

14. The method as defined in claim 13 including depositing about 10 to 25 microns of said photoconductive layer from a reaction gas mixture of $SiH_4$, $SiF_4$, $B_2H_6$ and $H_2$.

15. The method as defined in claim 1 including depositing said photoconductive layer from a reaction gas mixture including silicon, hydrogen and a p-type dopant.

16. The method as defined in claim 15 including depositing about 10 to 25 microns of said photoconductive layer from a reaction gas mixture of $SiH_4$, $B_2H_6$ and $H_2$.

17. The method as defined in claim 1 including depositing said photoconductive layer with an effective power density in the range of 0.1 to 1.0 watts per cubic centimeter.

18. The method as defined in claim 1 including depositing said photoconductive layer at a deposition rate of at least 100 Angstroms per second at an operating pressure of less than 0.1 Torr.

19. The method as defined in claim 1 including depositing said bottom blocking layer by adding an n-type dopant.

20. The method as defined in claim 19 including depositing said bottom blocking layer from a reaction gas mixture including silicon, fluorine, hydrogen and phosphorus.

21. The method as defined in claim 20 including depositing about 200 to 2000 Angstroms of said bottom blocking layer onto said substrate from a reaction gas mixture of $SiH_4$, $SiF_4$, $PH_3$ and $H_2$.

22. The method as defined in claim 19 including depositing said bottom blocking layer from a reaction gas mixture including silicon, hydrogen and phosphorus.

23. The method as defined in claim 22 including depositing about 200 to 2000 Angstroms of said bottom blocking layer onto said substrate from a reaction gas mixture of $SiH_4$, $PH_3$ and $H_2$.

24. The method as defined in claim 1 including depositing said second photoconductive layer from a reaction gas mixture including silicon, fluorine and hydrogen.

25. The method as defined in claim 24 including depositing about 10 to 25 microns of said photoconductive layer from a reaction gas mixture of $SiH_4$ and $SiF_4$.

26. The method as defined in claim 1 including depositing said photoconductive layer from a reaction gas mixture including silicon and hydrogen.

27. The method as defined in claim 26 including depositing about 10 to 25 microns of said photoconductive layer from a reaction gas mixture of $SiH_4$.

28. The method as defined in claim 1 including depositing said stabilizing layer from a reaction gas mixture including silicon, fluorine, hydrogen and at least one of carbon, nitrogen or oxygen.

29. The method as defined in claim 28 including depositing about 50 to 1000 Angstroms of said stabilizing layer from a reaction gas mixture of $SiH_4$, $SiF_4$ and $CH_4$.

30. The method as defined in claim 1 including depositing said stabilizing layer from a reaction gas mixture including silicon, hydrogen and at least one of carbon, nitrogen or oxygen.

31. The method as defined in claim 30 including depositing about 200 to 1000 Angstroms of said stabilizing layer from a reaction gas mixture of $SiH_4$ and $CH_4$.

32. The method as defined in claim 1 including depositing said stabilizing layer with a power density in the range of 0.2 to 1.2 watts per cubic centimeter.

33. The method as defined in claim 1 including depositing said stabilizing layer at a deposition rate of at least 30 Angstroms per second.

34. The method as defined in claim 1 including depositing said enhancement layer from a mixture including silicon, hydrogen and a p-type dopant.

35. The method as defined in claim 34 including depositing said enhancement layer from a mixture including silicon, hydrogen, fluorine and boron.

36. The method as defined in claim 35 including depositing about a depletion width of said enhancement layer from a reaction gas mixture of $SiH_4$, $SiF_4$, $B_2H_6$ and $H_2$.

37. The method as defined in claim 36 including depositing about 1000 to 4000 Angstroms of said enhancement layer.

38. The method as defined in claim 1 including depositing said enhancement layer from a mixture including silicon and hydrogen.

39. The method as defined in claim 1 including depositing said enhancement layer from a mixture including silicon, hydrogen and fluorine.

40. The method as defined in claim 39 including depositing about a depletion width of said enhancement layer from a reaction gas mixture of $SiH_4$ and $SiF_4$.

41. The method as defined in claim 1 including depositing about 1000 to 4000 Angstroms of said enhancement layer.

42. The method as defined in claim 1 including depositing said enhancement layer as a substantially intrinsic layer.

43. A method of manufacturing a photoconductive member utilizing microwave energy, said member comprising an electrically conductive substrate member, a bottom blocking layer on the substrate member, and a photoconductive layer on the bottom blocking layer the improved method including the steps of:
   utilizing microwave energy to generate a plasma so as to deposit the bottom blocking layer as a positively or negatively doped, polycrystalline layer of semiconductor alloy material upon the substrate member at an operating pressure about an order of magnitude at conventional RF deposition pressure;
   depositing a photoconductive layer on the bottom blocking layer.

44. The method as defined in claim 43, including the further step of;
   utilizing microwave energy to deposit above the photoconductive layer the top stabilizing layer from a reaction gas mixture which includes at least one of oxygen, carbon or nitrogen.

45. The method as defined in claim 44, wherein the manufacture includes the further steps of;
   disposing the substrate member in the deposition region of an evacuable deposition chamber;
   providing a source of microwave energy in operative communication with the deposition region;
   evacuating the deposition chamber to a pressure less than atmospheric;
   introducing a semiconductor containing process gas mixture into the deposition region; and
   energizing the source of microwave energy so as to deposit said bottom blocking layer, said photoconductive layer and said top stabilizing layer.

46. The method as defined in claim 45, including the further step of utilizing microwave energy to an enhancement layer between the photoconductive layer and the top stabilizing layer.

47. The method as defined in claim 43, wherein the step of depositing a doped, polycrystalline semiconductor alloy layer comprises depositing a p-doped silicon:hydrogen:fluorine alloy layer.

48. The method as defined in claim 43, wherein the step of depositing a doped, polycrystalline semiconductor alloy layer comprises depositing an n-doped silicon:hydrogen: fluorine alloy layer.

* * * * *